United States Patent
Baek et al.

(10) Patent No.: US 7,432,193 B2
(45) Date of Patent: Oct. 7, 2008

(54) METHOD FOR FABRICATING A THIN FILM AND A METAL LINE OF A SEMICONDUCTOR DEVICE

(75) Inventors: In-Cheol Baek, Seoul (KR); Han-Choon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/640,916

(22) Filed: Dec. 19, 2006

(65) Prior Publication Data
US 2007/0155163 A1    Jul. 5, 2007

(30) Foreign Application Priority Data
Dec. 29, 2005    (KR)    ............... 10-2005-0134357

(51) Int. Cl.
*H01L 21/4763*    (2006.01)

(52) U.S. Cl. ................ 438/627; 438/685; 257/E21.04
(58) Field of Classification Search ................ 438/627, 438/685, 584, 597, 618, 622; 257/E21.04
See application file for complete search history.

(56) References Cited

U.S. PATENT DOCUMENTS 7,229,918 B2 *    6/2007    Moon ...................... 438/658
2003/0133849 A1 *    7/2003    Schumacher et al. ........ 422/172

* cited by examiner

*Primary Examiner*—Brook Kebede
*Assistant Examiner*—Kevin A Parendo
(74) *Attorney, Agent, or Firm*—Finnegan, Henderson, Farabow, Garrett, & Dunner, L.L.P.

(57) ABSTRACT

A method for forming a thin film of a semiconductor device is provided. The method includes forming a TaN film on a semiconductor substrate by employing an atomic layer deposition method; and converting a part of the TaN film into a Ta by reacting the TaN film with $NO_2$ to form a Ta film. The $NO_2$ is formed by reacting $NH_3$ with $O_2$.

8 Claims, 4 Drawing Sheets

METHOD FOR FABRICATING A THIN FILM AND A METAL LINE OF A SEMICONDUCTOR DEVICE

RELATED APPLICATION

This application is based upon and claims the benefit of priority to Korean Application No. 10-2005-0134357, filed on Dec. 29, 2005, the entire contents of which are incorporated herein by reference.

TECHNICAL FIELD

The present invention relates to a method for forming a metal line of a semiconductor device, and more particularly, to a method for manufacturing a semiconductor device having a copper wiring.

BACKGROUND

With the realization of high-speed and highly integrated semiconductor devices, metal lines formed within the semiconductor devices are getting finer with multi layers. In such a case, the widths of the metal lines are decreased as well, thereby causing a signal delay due to the resistance and capacitance of the metal lines. Thus, to reduce such a signal delay, copper having a low resistance has been widely employed for the formation of the metal line.

In contrast to conventional metals employed, copper is difficult to etch. Accordingly, a copper wiring is formed through a damascene process including the steps of: forming a trench first; then forming a copper layer to fill the trench; and finally performing a chemical mechanical polishing thereon.

Since copper tends to diffuse into other layers easily, a barrier layer is formed on the trench before filling the trench with copper.

Though the barrier layer can be formed of Ta film, a Ta film cannot prevent the diffusion of copper perfectly. For this reason, the barrier layer has been formed of TaN. However, the TaN film is disadvantageous in that its adhesive strength with copper is low, though it can prevent the diffusion of copper more effectively than the Ta film.

Thus, nowadays, the barrier layer is formed of a dual film of Ta/TaN, so as to improve the reliability of the semiconductor device. The dual-film barrier layer can be formed by using a physical vapor deposition (PVD) process or an atomic layer deposition (ALD) process.

However, when the dual-film barrier layer is formed by the PVD process, an overhanging phenomenon may occur, in which an entrance of a via is blocked, if the aspect ratio (a ratio of a depth to a width) of the via is large, which results in a failure to form a barrier layer appropriately.

Meanwhile, when forming the dual-film barrier layer by the ALD method, a TaN film and a Ta film are formed by using different precursors, so the whole process becomes complicated. Furthermore, since carbon (C) and oxygen (O) are contained in the obtained TaN film, the resistivity of the TaN film is increased.

SUMMARY

Therefore, consistent with the present invention, there is provided a method for forming a dual film of Ta/TaN easily without causing an overhanging phenomenon.

In accordance with a first aspect consistent with the present invention, there is provided a method for forming a thin film of a semiconductor device. The method includes the steps of: forming a TaN film on a semiconductor substrate by employing an atomic layer deposition method; and converting a part of the TaN film into a Ta film by reacting the TaN film with $NO_2$.

In accordance with a second aspect consistent with the present invention, there is provided a method for forming a metal line of a semiconductor device. The method includes the steps of: (a) forming an interlayer insulating film on a semiconductor substrate; (b) forming a trench on the interlayer insulating film; (c) forming a TaN film on the semiconductor substrate formed in step (b), the TaN film being formed of TaN by employing an ALD method; (d) converting a part of TaN film into a Ta film by reacting the TaN film with $NO_2$; and (e) forming a metal line on the Ta film.

BRIEF DESCRIPTION OF THE DRAWINGS

The above and other features consistent with the present invention will become apparent from the following description of preferred embodiments, given in conjunction with the accompanying drawings, in which.

DETAILED DESCRIPTION

Hereinafter, preferred embodiments consistent with the present invention will be described in detail with reference to the accompanying drawings so that the present invention may be easily implemented by those skilled in the art. However, it is to be appreciated that the present invention is not limited to the preferred embodiments and may be varied in various ways.

Figure 1:
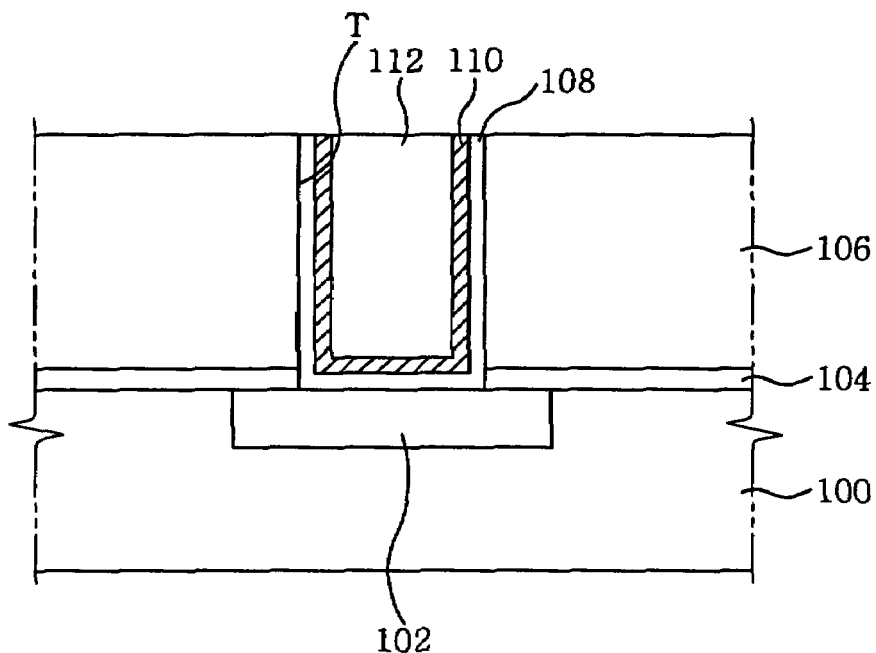
FIG. 1 is a cross sectional view of a metal line of a semiconductor device consistent with a first preferred embodiment of the present invention.

Referring to FIG. 1, there is provided a cross sectional view of a metal line 112 of a semiconductor device 10 consistent with a first preferred embodiment of the present invention.

As shown in FIG. 1, an etch stop layer 104 and an interlayer insulating film 106 are formed on a substrate 100. Substrate 100 may include individual devices (not shown) or a lower conductor 102.

Lower conductor 102 may be formed of copper (Cu), aluminum (Al), tungsten (W), silver (Ag), gold (Au), platinum (Pt), or the like. Etch stop layer 104 may be made of SiN, $SiH_4$, or the like. Interlayer insulating film 106 may be formed by depositing an organic or inorganic insulating material, such as a fluorine silicate glass (FSG), an undoped silicate glass (USG), $SiH_4$, and a tetra ethylortho silicate (TEOS) in a single layer or in multiple layers. Alternatively, interlayer insulating layer 104 may be formed of a low-k material, such as a black diamond (BD) having a dielectric constant not greater than a value of 3.0.

Formed through etch stop layer 104 and interlayer insulating film 106 is a trench T through which lower conductor 102 of substrate 100 is exposed.

Further, formed inside trench T are first and second barrier metal layers 108 and 110, and metal line 112 that is electrically connected to lower conductor 102.

Barrier metal layers 108 and 110 prevent a metal material of metal line 112 from being diffused into another layer such as an insulating film, while enhancing the adhesion of insulating film 106 and metal line 112.

Further, first and second barrier metal layer 108 and 110 form a dual barrier structure together. First barrier metal layer 108 may be formed of TaN, while second barrier metal layer 110 may be formed of Ta. Metal line 112 may be formed of a conductive material such as copper having a low resistance.

Below, a method for forming metal line 112 of semiconductor device 10 of FIG. 1 will be explained with reference to FIGS. 2 and 3 together with FIG. 1.

Figure 2:
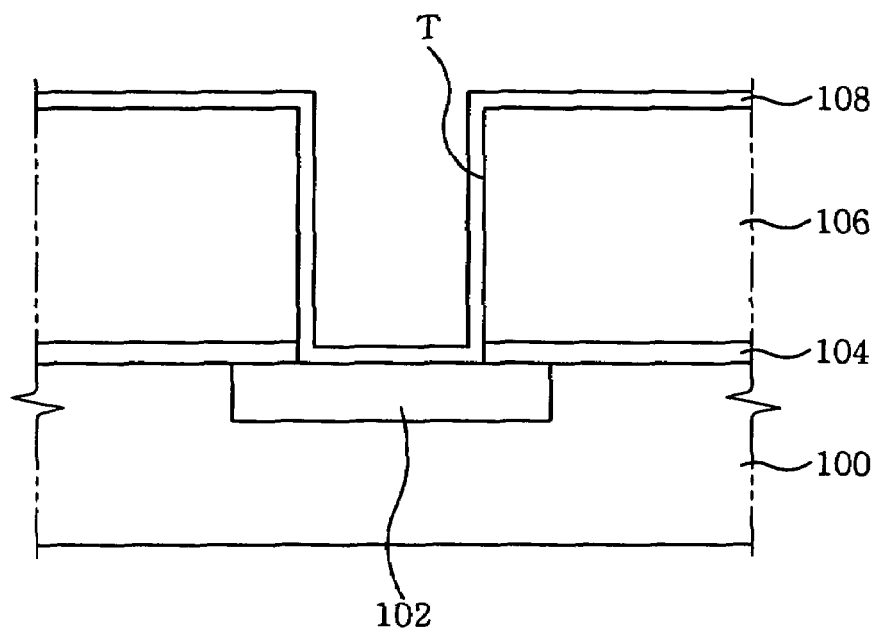
FIGS. 2 and 3 provide cross sectional views describing a method for forming the metal line of the semiconductor device shown in FIG. 1, wherein initial stages of the method are omitted.
Figure 3:
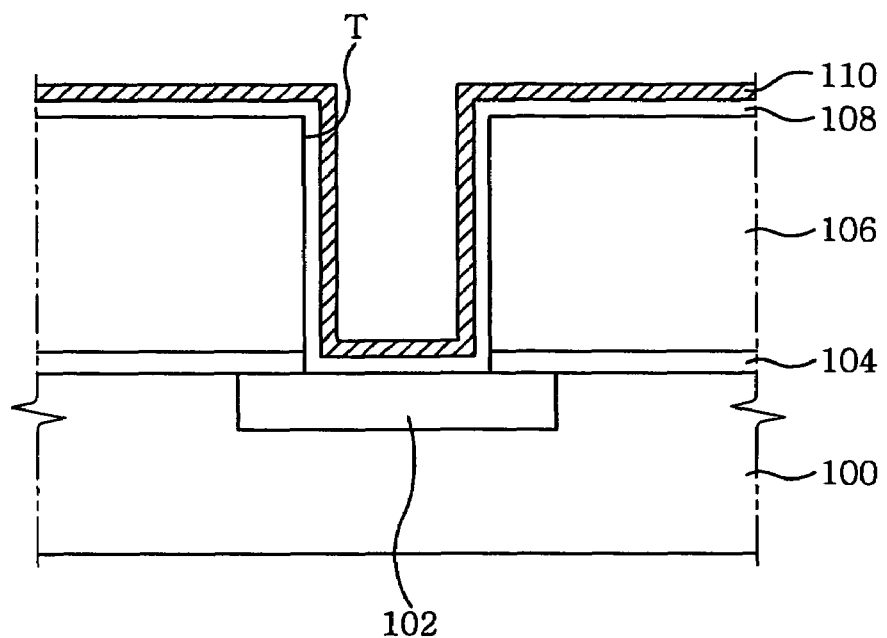

FIGS. 2 and 3 provide cross sectional views to describe a method for forming metal line 112 of semiconductor device 10 in FIG. 1 consistent with the first preferred embodiment of the present invention, wherein initial steps of the method are omitted.

As shown in FIG. 2, etch stop layer 104 and interlayer insulating film 106 are deposited on substrate 100 having lower conductor 102. Then, trench T is formed on interlayer insulating film 106 through a selective etching process using a photoresist film (not shown) such that etch stop layer 104 is partially exposed through trench T.

Thereafter, the exposed part of etch stop layer 104 is removed, so that lower conductor 102 is partially exposed. Subsequently, TaN is deposited by using an Atomic Layer Deposition (ALD) method while maintaining substrate 100 at a temperature of about 250 to 300° C., thus obtaining first barrier metal layer 108. First barrier metal layer 108 is formed to have a thickness of about 7 nm or less, preferably 1 nm.

As a reaction gas for forming first barrier metal layer 108, ertbutylimido(trisdiethylamide)tantalum (TBTDET), pentakis(diethylamide)tantalum (PEEAT), pentakis(dimethylamide)tantalum (PDMAT), pentakis(ethylmethylamino)tantalum (PEAMT), or the like may be employed.

First barrier metal layer 108 thus formed may contain carbon (C) and oxygen (O).

Then, first barrier metal layer 108 is reacted with an oxidizing ammonia. As a result, N of first barrier metal layer 108 is removed, such that a part of first barrier metal layer 108 is converted into Ta, thereby forming second barrier metal layer 110 made of Ta, as shown in FIG. 3. First barrier metal layer 108 is reacted with the oxidizing ammonia until the thickness of second barrier metal layer 110 becomes approximately identical with that of first barrier metal layer 108.

During this process, carbon (C) and oxygen (O) contained in first barrier metal layer 108 are also removed, so that TaN of the remaining first barrier metal layer 108 may have a higher purity.

$NO_2$, which is formed by reacting $NO_3$ with $O_2$ at a high temperature, is employed as the oxidizing ammonia.

Then, referring back to FIG. 1, copper is deposited on second barrier metal layer 110, so that a copper layer that fills trench T defined by second barrier metal layer 110 is obtained. Subsequently, by planarizing through a chemical mechanical polishing process, metal line 112, and barrier metal layers 108 and 110 are finally obtained.

Figure 4:
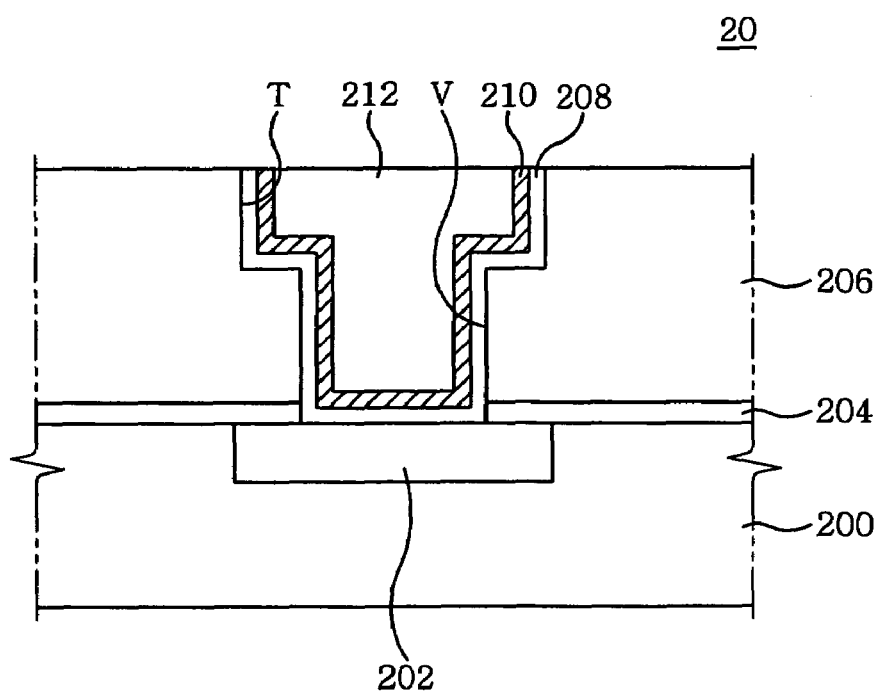
FIG. 4 is a cross sectional view of a metal line of a semiconductor device consistent with a second preferred embodiment of the present invention.

FIG. 4 is a cross sectional view of a metal line 212 of a semiconductor device 20 consistent with a second preferred embodiment of the present invention.

As shown in FIG. 4, an etch stop layer 204 and an interlayer insulating film 206 are formed on a substrate 200. Substrate 200 may include individual devices (not shown) or a lower conductor 202.

Lower conductor 202 may be formed of copper (Cu), aluminum (Al), tungsten (W), silver (Ag), gold (Au), platinum (Pt), or the like. Etch stop layer 204 may be made of SiN, $SiH_4$, or the like. Interlayer insulating film 206 may be formed by depositing an organic or inorganic insulating material, such as a fluorine silicate glass (FSG), an undoped silicate glass (USG), $SiH_4$, and a tetra ethylortho silicate (TEOS) in a single layer or multiple layers. Alternatively, interlayer insulating film 204 may be formed of a low-k material, such as a black diamond (BD) having a dielectric constant not greater than a value of 3.0.

Formed in etch stop layer 204 and interlayer insulating film 206 is a via V through which lower conductor 202 of substrate 200 is exposed, and a trench T through which via V is exposed.

Further, deposited inside trench T and via V are first and second barrier metal layers 208 and 210, and metal line 212 that are electrically connected to lower conductor 202.

Barrier metal layers 208 and 210 prevent a metal material of metal line 212 from being diffused into another layer such as insulating film 206, while enhancing the adhesion of insulating film 206 and metal line 212.

Further, first and second barrier metal layers 208 and 210 form a dual barrier structure together. First barrier metal layer 208 is formed of TaN, while second barrier metal layer 210 is formed of Ta. Metal line 212 is made of a conductive material such as copper having a low resistance.

Below, a method for forming metal line 212 of semiconductor device 20 of FIG. 4 will be explained with reference to FIGS. 5 to 7 together with FIG. 4.

Figure 5:
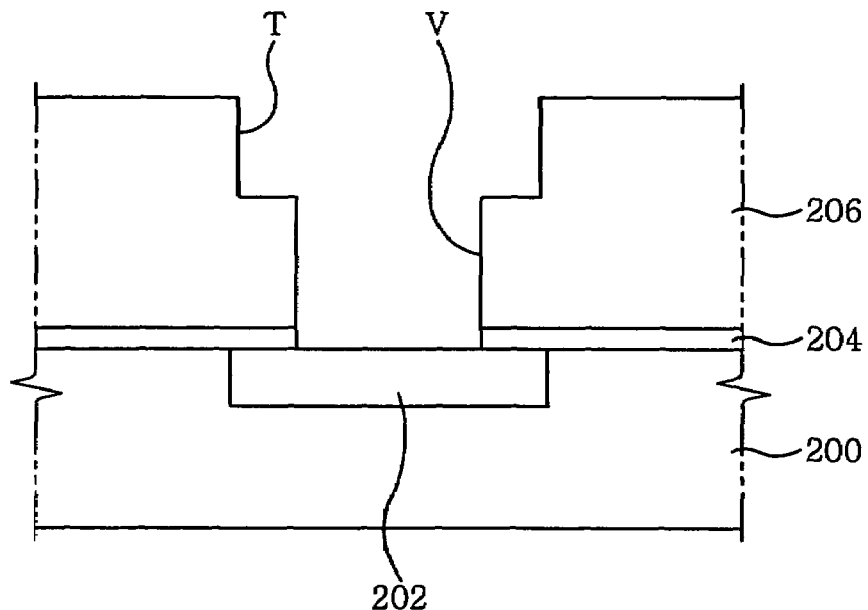
FIGS. 5 to 7 present cross sectional views describing a method for forming the semiconductor device shown in FIG. 4, wherein initial stages of the method are omitted.
Figure 6:
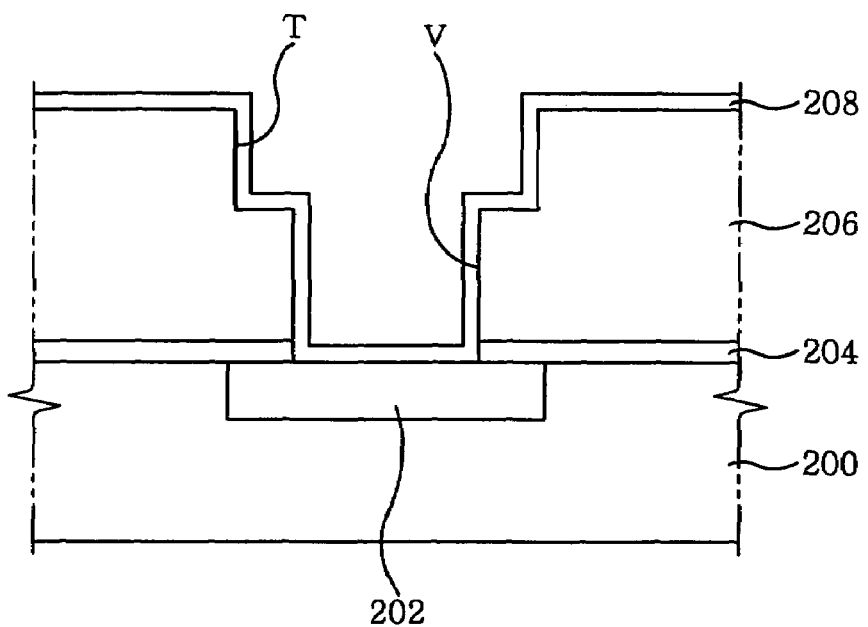
Figure 7:
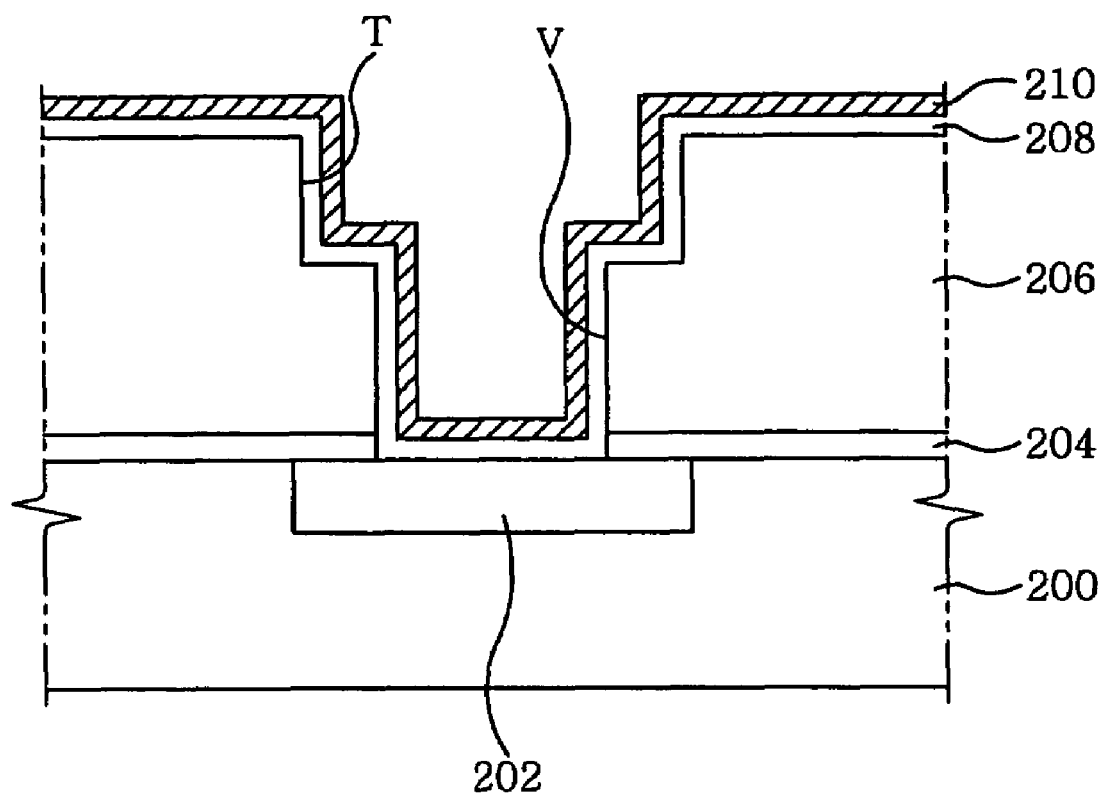

FIGS. 5 to 7 provide cross sectional views to describe a method for forming metal line 212 of semiconductor device 20 in FIG. 4 consistent with the second embodiment of the present invention, wherein initial steps of the method are omitted.

As shown in FIG. 5, an etch stop layer 204 and an interlayer insulating film 206 are deposited on a substrate 200 having a lower conductor 202.

Then, a via V for allowing etch stop layer 204 to be exposed therethrough is formed in interlayer insulating film 206 through a selective etching process using a photoresist film (not shown). Thereafter, a trench T is formed in interlayer insulating film 206 through a selective etching process using a photoresist film (not shown) such that via V is exposed through trench T. In case interlayer insulating film 206 is formed in a multiple of layers, one of the multi layers of interlayer insulating film 206 may be used as an etching stop layer when trench T is formed.

Thereafter, as illustrated in FIG. 6, exposed etching stop layer 204 is removed, so that lower conductor 202 is partially exposed. Subsequently, TaN is deposited by using an ALD process while maintaining substrate 200 at a temperature of about 250 to 300° C., thus obtaining a first barrier metal layer 208. First barrier metal layer 208 is formed to have a thickness of about 7 nm or less, preferably 1 nm.

As a reaction gas for forming first barrier metal layer 208, ertbutylimido (trisdiethylamide) tantalum (TBTDET), pentakis (diethylamide) tantalum (PDEAT), pentakis(dimethylamide)tantalum (PDMAT), pentakis (ethylmethylamino) tantalum (PEAMT), or the like may be employed.

First barrier metal layer 208 thus formed may contain carbon (C) and oxygen (O).

Then, first barrier metal layer 108 is reacted with an oxidizing ammonia. Substrate 200 is submerged in a diluted $HNO_3$ solution. As a result, N of first barrier metal layer 208 is removed, such that a part of first barrier metal layer 208 is converted into Ta, allowing a second barrier metal layer 210 made of Ta to be formed, as shown in FIG. 7. First barrier metal layer 108 is reacted with the oxidizing ammonia until the thickness of second barrier metal layer 210 becomes approximately identical with that of first barrier metal layer 208.

During this process, carbon (C) and oxygen (O) contained in first barrier metal layer 208 are also removed, so that the TaN of remaining first barrier metal layer 208 may have a higher purity.

$NO_2$, which is formed by reacting $NO_3$ with $O_2$ at a high temperature, is employed as the oxidizing ammonia.

Then, referring back to FIG. 4, copper is deposited on second barrier metal layer 210, so that a copper layer that fills via V and trench T defined by second barrier metal layer 210 is obtained. Subsequently, by planarizing through a chemical mechanical polishing process, metal line 212, and barrier metal layers 208 and 210 are finally obtained.

Consistent with the present invention as described above, it is possible to remove impurities contained in barrier metal layers when they are formed the ALD method. Therefore, the resistivity of the barrier film layers may be reduced. Further, the barrier film layers may have a higher density.

Moreover, since the Ta film may be easily formed from the TaN film, which is formed by the ALD method, the whole process for forming the thin films and the semiconductor device may be simplified by using a nitric acid solution.

While the invention has been shown and described with respect to the preferred embodiments, it is to be understood by those skilled in the art that various changes and modifications may be made without departing from the spirit and scope of the invention as defined in the following claims.

What is claimed is:

1. A method for forming a thin film of a semiconductor device, comprising the steps of:
   forming a TaN film on a semiconductor substrate by employing an atomic layer deposition process; and
   converting a part of the TaN film into a Ta film by reacting the TaN film with $NO_2$.

2. The method of claim 1, wherein the $NO_2$ is formed by reacting $NH_3$ with $O_2$.

3. The method of claim 1, wherein the TaN film has a thickness of about 7 nm or less.

4. The method of claim 1, wherein the Ta film has a thickness of about a half of that of the TaN film.

5. A method for forming a metal line of a semiconductor device, comprising:
   forming an interlayer insulating film on a semiconductor substrate;
   forming a trench on the interlayer insulating film;
   forming a TaN film on the semiconductor substrate, the TaN film being formed by employing an atomic layer deposition (ALD) process;
   converting a part of TaN film into a Ta film by reacting the TaN film with $NO_2$; and
   forming a metal line on the Ta film.

6. The method of claim 5, wherein the $NO_2$ is formed by reacting $NH_3$ with $O_2$.

7. The method of claim 5, wherein the TaN film has a thickness of about 7 nm or less.

8. The method of claim 5, wherein the Ta film has a thickness of about a half of that of the TaN film.

* * * * *